United States Patent
Simizu

(10) Patent No.: US 6,906,336 B2
(45) Date of Patent: Jun. 14, 2005

(54) METHODS FOR REDUCING BLUR AND VARIATION IN BLUR IN PROJECTED IMAGES PRODUCED BY CHARGED-PARTICLE-BEAM MICROLITHOGRAPHY

(75) Inventor: Hiroyasu Simizu, Kawasaki (JP)

(73) Assignee: Nikon Corporation, Tokyo (JP)

( * ) Notice: Subject to any disclaimer, the term of this patent is extended or adjusted under 35 U.S.C. 154(b) by 174 days.

(21) Appl. No.: 10/251,571

(22) Filed: Sep. 20, 2002

(65) Prior Publication Data

US 2003/0059716 A1 Mar. 27, 2003

(30) Foreign Application Priority Data

Sep. 21, 2001 (JP) .................................... 2001-289442

(51) Int. Cl.[7] .................. H01J 37/14; H01J 37/21; G03C 5/00; A61N 5/00; G21G 5/00
(52) U.S. Cl. .................. 250/492.22; 250/492.1; 250/492.2; 250/492.3; 250/396 ML; 250/396 R; 250/398; 430/296; 430/942
(58) Field of Search .................. 250/492.22, 492.1–3, 250/396 R, 398, 396 ML; 430/296, 942, 30

(56) References Cited

U.S. PATENT DOCUMENTS

| 4,198,569 A | * | 4/1980 | Takayama ................ 250/492.2 |
| 5,834,783 A | * | 11/1998 | Muraki et al. .............. 250/398 |
| 5,973,332 A | * | 10/1999 | Muraki et al. ............ 250/492.2 |
| 6,166,387 A | * | 12/2000 | Muraki et al. ............ 250/492.2 |
| 6,277,531 B1 | * | 8/2001 | Morita .......................... 430/30 |
| 6,323,499 B1 | * | 11/2001 | Muraki et al. ......... 250/492.22 |
| 2003/0059716 A1 | * | 3/2003 | Simizu ....................... 430/296 |
| 2003/0107006 A1 | * | 6/2003 | Muraki ..................... 250/491.1 |

OTHER PUBLICATIONS

U.S. Appl. No. 09/843,592, filed Apr. 26, 2001, Yamada et al.
U.S. Appl. No. 09/901,766, filed Jul. 9, 2001, Simizu.

* cited by examiner

Primary Examiner—John R. Lee
Assistant Examiner—Bernard E. Souw
(74) Attorney, Agent, or Firm—Klarquist Sparkman, LLP

(57) ABSTRACT

Exposure methods are disclosed for use in charged-particle-beam microlithography and that yield decreased blur and variation in blur within individual exposure fields (subfields) of a pattern. Blur at a location on the optical axis increases monotonically with increased shift in the focal point of a subfield image on the substrate. In contrast, blur at a subfield edge exhibits comparatively little change over a limited range in focal-point shift, and exhibits sharply increased change as the shift in focal point exceeds a threshold. Variation in blur within individual subfields decreases monotonically with increased shift in the focal point. Consequently, by changing the focal point during exposure, within a range in which maximum blur within the subfield is within an acceptable range, Δblur is decreased more than conventionally, thereby increasing the uniformity of blur within the projected subfield.

26 Claims, 6 Drawing Sheets

METHODS FOR REDUCING BLUR AND VARIATION IN BLUR IN PROJECTED IMAGES PRODUCED BY CHARGED-PARTICLE-BEAM MICROLITHOGRAPHY

FIELD

This disclosure pertains to microlithography, which is a key technology used in the manufacture of micro-electronic devices such as semiconductor integrated circuits, displays, and the like. More specifically, the disclosure pertains to microlithography performed using a charged particle beam such as an electron beam or ion beam. Even more specifically, the disclosure pertains to methods for reducing blur and variation in blur within single exposure subfields.

BACKGROUND

In microlithography (projection-transfer or projection-exposure) of a chip pattern using a charged particle beam, the pattern is defined on a reticle that must be divided into a large number of exposure units that are individually exposed. The main reasons for dividing the pattern are that (1) it currently is impossible to fabricate a reticle defining an entire chip pattern that can be exposed in one shot, and (2) it currently is impossible to fabricate a charged-particle-beam (CPB) optical system capable of projection-exposing an entire reticle pattern in one shot while reducing aberrations (especially off-axis aberrations) to a suitably low level over the entire field.

The divided exposure units on a reticle for CPB microlithography usually are termed "subfields." Each subfield defines a respective portion of the overall pattern, and each subfield is projection-transferred individually. Typically, the subfields are arranged on the reticle and exposed in sequential order. On the lithographic substrate, usually a semiconductor wafer coated with a suitable "resist," the subfield images are formed and located in a manner that results in the individual images being "stitched" together in a contiguous manner that forms the entire pattern after all the subfields are exposed.

Even though subfield images can be projection-transferred with high accuracy and precision, projection-transfer of a highly intricate pattern using a charged particle beam usually requires that beam "blur" be reduced as much as possible so as to achieve the necessary high resolution of fine pattern elements in individual subfield images on the substrate. It also is necessary to achieve the lowest possible variation in blur in individual subfield images. I.e., blur variation (termed "$\Delta$blur") within each exposure field and from one exposure field to the next should be as low as possible. Otherwise, excessive $\Delta$blur causes excessive variation in the linewidth of pattern elements within individual exposure fields and from one exposure field to the next. Minimizing $\Delta$blur also simplifies the implementation of corrective action to reduce blur.

In order to increase the fineness of line widths in patterns transferred by CPB microlithography and to obtain higher throughput, the sizes of individual subfields has been increasing recently. As subfield areas increase, however, $\Delta$blur within individual subfield images also increases and thus becomes more of a problem.

The $\Delta$blur within an individual exposure field is plotted in FIG. 7, which is a graph showing the relationship between the position of the image plane and blur at various locations A, B, C, D, E within the exposure field (i.e., within a subfield). The abscissa is the position of the image plane on the Z-axis (parallel to the optical axis of the CPB optical system), and the origin corresponds with the Gaussian image-plane position. The ordinate is blur, wherein minimal blur in this instance occurs at the origin. The five curves correspond to the five locations A–E, respectively, and are labeled similarly. Point A is located at the optical axis. The curve denoted "A" indicates the manner in which blur changes, at the point A, with corresponding changes in the Z-position of the image plane. Point E is located at the edge of the subfield. The curve denoted "E" indicates the manner in which blur changes, at the point E, with corresponding changes in the Z-position of the image plane. The curves denoted "B", "C", and "D" are respective plots of blur at corresponding points B, C, D, located between the points A and E, at increasing distance from the optical axis, respectively.

In other words, at the Gaussian-image plane where a wafer normally would be placed, blur is minimal at the optical axis (curve A), and maximal at the edge of the sub-field (curve E). In this figure, the line OF is $\Delta$blur exhibited in an exposure field of a substrate (wafer) situated at the Gaussian-image plane. Moving the wafer to a position (on the Z-axis) displaced from the Gaussian-image plane (e.g., any of curves B, C, D, or E) increases minimum blur but also allows $\Delta$blur to be decreased. For example, by placing the wafer at the position "G" in FIG. 7, minimum blur is the magnitude of blur corresponding to the point "H," and maximum blur is the magnitude of blur corresponding to the point "I". Thus, $\Delta$blur corresponds to the length HI, which is shorter than the length OF.

However, in these conventional methods involving shifting the substrate position away from the Gaussian-image plane before making individual subfield exposures, there are limits to the extent to which $\Delta$blur can be reduced. Specifically, as the size of the exposure field has continued to increase, it has become impossible to reduce $\Delta$blur to the necessary extent using these methods.

Another way, suggested in the prior art, for minimizing $\Delta$blur involves offsetting, in advance of exposure, linewidths of pattern elements defined on the reticle. The offset is defined on the reticle according to the position (distance and direction from the optical axis) within the subfield during reticle preparation. However, converting reticle-preparation and reticle-design data in this manner into actual exposure data places an enormous data-processing burden on the data-conversion system.

SUMMARY

In view of the shortcomings of the prior art as summarized above, the present invention provides, inter alia, charged-particle-beam (CPB) microlithography (projection-exposure) methods that exhibit less variation in blur ($\Delta$blur) within a single exposure field (e.g., subfield) than achievable using conventional methods.

According to a first aspect of the invention, methods are provided, in the context of performing a CPB microlithographic exposure of a pattern from a reticle to a substrate, for performing an exposure of at least a region of the pattern. In an embodiment of the method, the exposure is performed while simultaneously changing a focal point of an image of the exposed portion on the substrate.

In this method, the focal point can be changed in any of various ways. Desirably, the focal point is changed in a continuous scanning manner during the exposure. The focal point can be changed within a range in which maximum blur within the region is within a predetermined tolerance for blur. Alternatively, the focal point can be changed within a range in which maximum blur within the region is less than a predetermined threshold blur for the region. Further alternatively, the focal point can be changed within a range in which a plot of blur versus focal point at an edge of the region is substantially horizontal. Further alternatively, the focal point can be changed within a range in which a shift in focal point does not exceed field curvature at an edge of the region. Further alternatively, the focal point can be changed by scanning the focal point in a vicinity of an image-plane position at which blur is at a minimum. Finally, the focal point can be changed by moving the substrate relative to a Gaussian-image plane for the substrate.

According to another aspect of the invention, methods are provided, in the context of CPB microlithography in which a substrate is exposed with a pattern defined on a reticle segmented into subfields each defining a respective portion of the pattern, and the subfields are exposed individually. The methods are directed to reducing at least one of blur and variation of blur in an image of a subfield as projected onto the substrate. An embodiment of such a method comprises simultaneously changing, during the exposure, the focal point of the respective subfield image as exposed onto the substrate. In this method, as in the methods summarized above, the focal point can be changed in any of various ways such as those listed above.

According to another aspect of the invention, CPB microlithography apparatus are provided. An embodiment of such an apparatus comprises a CPB optical system situated and configured to projection-expose respective images of subfields of a pattern, as defined on a reticle, onto a substrate. The apparatus also includes a dynamic-focus coil situated and configured, simultaneously during exposure of a subfield, to change the focal point of the respective subfield image on the substrate. The CPB optical system desirably comprises a projection-optical system situated between the reticle and the substrate, wherein the dynamic-focus coil is situated in the projection-optical system. The dynamic-focus coil desirably is configured to change the focal point in a continuous scanning manner during the exposure. The apparatus can further comprise means for moving the substrate relative to a Gaussian-image plane for the substrate, so as to change the focal point during the exposure.

The foregoing and additional features and advantages of the invention will be more readily apparent from the following detailed description, which proceeds with reference to the accompanying drawings.

DETAILED DESCRIPTION

The invention is described below in the context of representative embodiments that are not intended to be limiting in any way. Also, although the embodiments are described in the context of using an electron beam as an exemplary charged particle beam, it will be understood that the principles described herein are applicable with equal facility to use of an alternative charged particle beam, such as an ion beam.

Figure 1A:
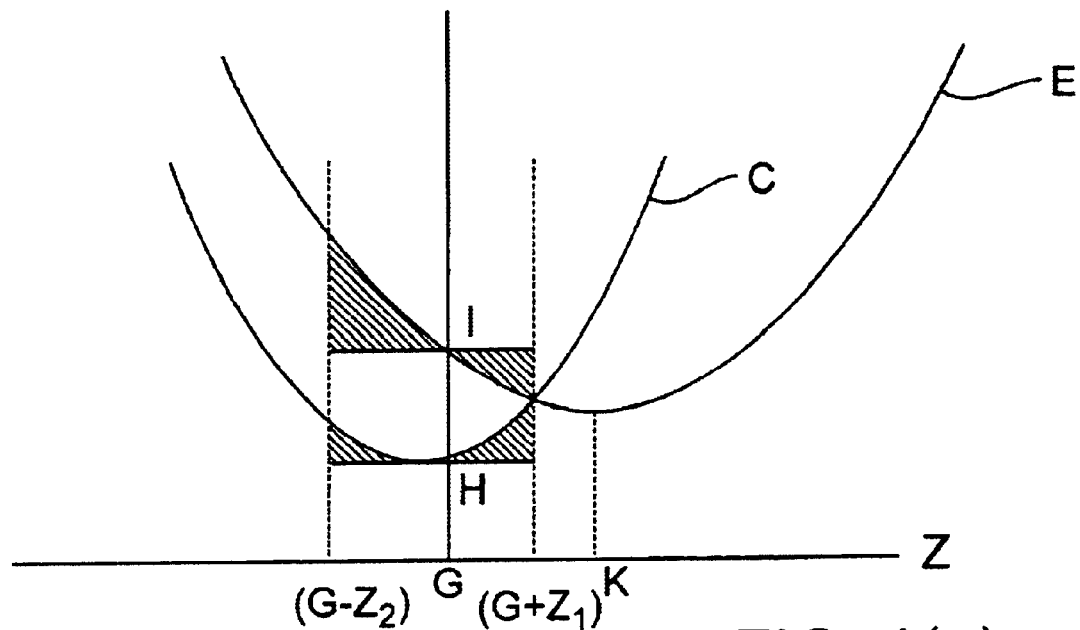
FIGS. 1(a)–1(b) are respective plots illustrating the general principle of reducing blur and Δblur according to an aspect of the invention.
Figure 1B:
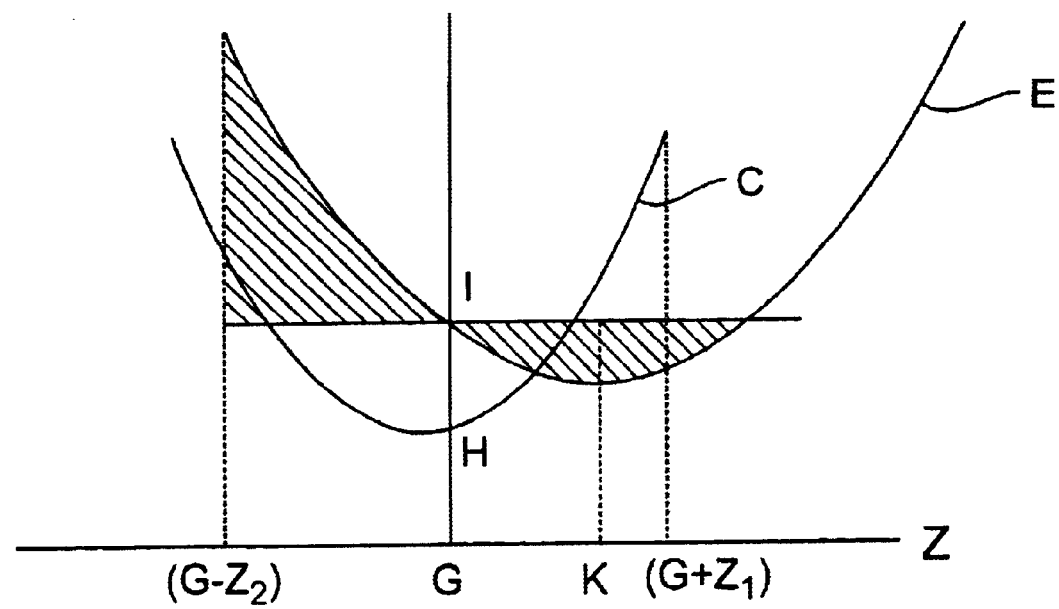
Figure 7:
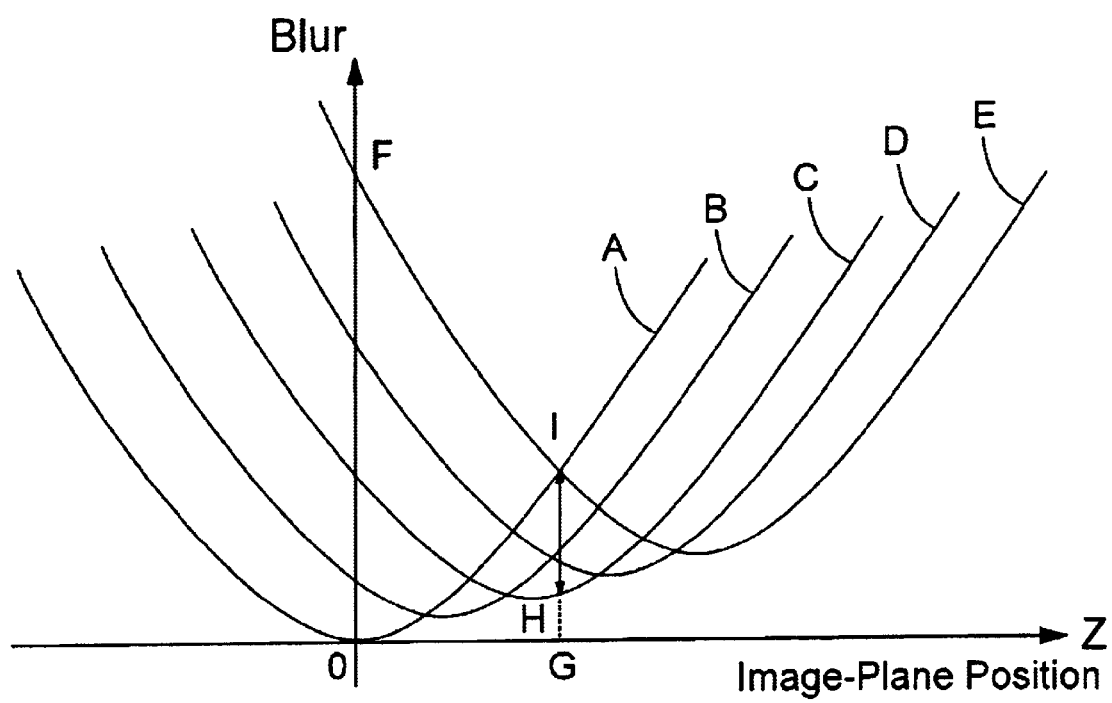
FIG. 7 depicts plots of respective blur, at each of various locations in a subfield, as a function of the location of the focal point.

In general, while performing a lithographic exposure, one or more exposures are performed while changing the focal point during the respective exposure. The underlying principle is explained with reference to FIGS. 1(a)–1(b) and 2, wherein FIGS. 1(a)–1(b) each depict a portion of FIG. 7 (in the region of the lines GI and the curves C and E) and use the same reference designators for the same respective features shown in FIG. 7. In FIGS. 1(a)–1(b), the image-plane position is situated at the point "G", at which maximum blur was minimized in FIG. 7. Moving the focal point from the Gaussian-image plane during exposure is the equivalent of moving the image-plane position during the exposure. For example, by shifting the focal point a distance $Z_2$ to the "+" side of the Gaussian-image plane (to the left in the figure), blur at the point G in FIG. 1(a) assumes a magnitude corresponding to the position (G–$Z_2$). Similarly, by shifting the focal point a distance $Z_1$ to the "–" side of the Gaussian-image plane (to the right in the figure), blur at the point G in FIG. 1(a) assumes a magnitude corresponding to the position (G+$Z_1$).

Now, assume that, during exposure, the image-plane position was changed continuously (i.e., "scanned") from (G–$Z_2$) to (G+$Z_1$), yielding a corresponding shift in the focal point. The resulting mean blur of a point in the subfield at which blur normally is minimal (curve C) is determined by integrating curve C from (G–$Z_2$) to (G+$Z_1$) and dividing by ($Z_1$+$Z_2$). Meanwhile, the resulting mean blur of a point, at the edge of the subfield, at which blur normally is maximum (curve E), is determined by integrating the curve E from (G–$Z_2$) to (G+$Z_1$) and dividing by ($Z_1$+$Z_2$). (Even though blur also is at a maximum at the position of the optical axis, only the subfield edge E will be explained in the following description since the same relationship is present at the field edge E.)

If $Z_1$=$Z_2$, then any increase in blur resulting from changing the focal point, relative to blur when there is no change in the focal point, will correspond with the areas of the regions indicated by the hatching in FIG. 1(a), taking into consideration the sign.

In FIG. 1(a), since blur increases at the point indicated by the curve C regardless of the direction in which the focal point is shifted, blur increases monotonically with corresponding changes in the focal point. In contrast, at the point indicated by the curve E, so long as the image-plane position does not change with movement of the focal point beyond the point K (at which blur is minimum), the direction of change in the magnitude of blur reverses when the focal point is on the positive side and when the focal point is on the negative side. Therefore, the magnitude of Δblur is small even when exposure is performed while changing the focal point.

As shown in FIG. 1(b), whenever $(G+Z_1)>K$, the area of the hatched region is increased with corresponding increases in the magnitude of change in the focal point, even at a point on the subfield edge (indicated by the curve E). Hence, blur increases sharply.

Figure 2:
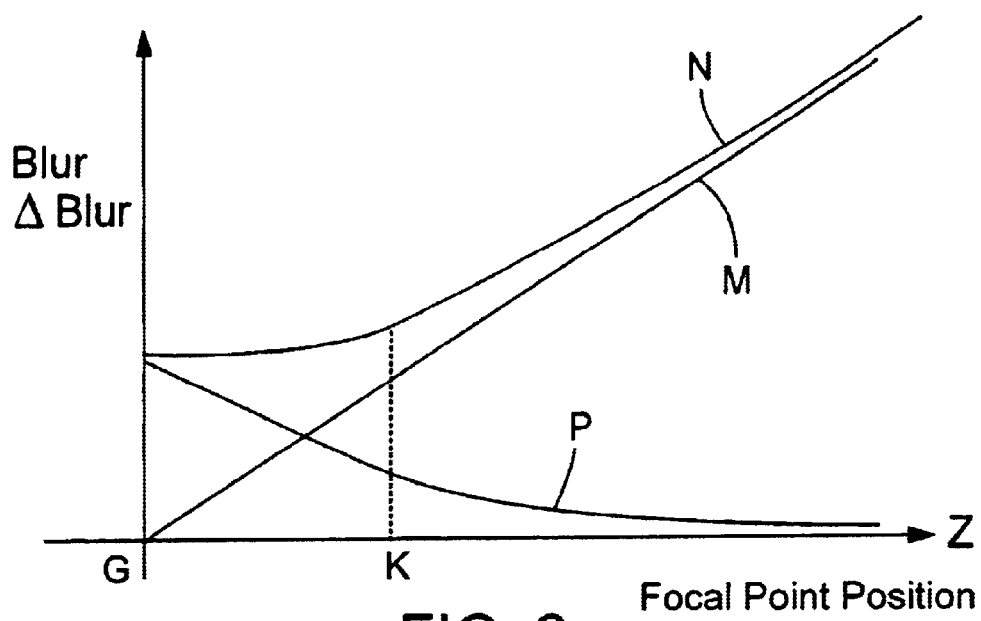
FIG. 2 is a plot showing the relationship between change in focal point (centered on the Gaussian image plane) and blur and Δblur.

These circumstances are shown in FIG. 2, in which the abscissa is the focal-point position, which changes with corresponding changes in the image-plane position. The point G is the center (of the focal-point scanning range), and the ordinate is blur and Δblur. The curve M denotes blur at the position of the optical axis, the curve N denotes blur at the edge of the subfield, and the curve P is Δblur, which is the difference between curves M and N.

As discussed above, the blur M at the point corresponding to the curve C increases monotonically with increases in the focal-point scanning range. The blur N at the subfield edge F hardly changes until the focal-point scanning range reaches point K in FIGS. 1(a)–1(b), beyond which blur increases sharply. Therefore, Δblur (namely, the variation in blur within a given subfield) decreases monotonically with increases in the focal-point scanning range. But, the rate of the decrease diminishes and tends to saturation when the focal point passes beyond the point K. If the range of focal point should become excessively wide, then the maximum blur within the subfield would become excessive.

Consequently, during exposure, by changing the focal point within a range in which the maximum blur within the subfield is within a tolerable range, Δblur can be minimized (i.e., the uniformity of blur within the subfield can be improved). In particular, if the change in focal point can be limited to a range in which the curve N is nearly ("substantially") horizontal (up to the point K in FIG. 2), then Δblur can be minimized and the uniformity of blur within the subfield can be increased without any substantial change in the maximum blur within the subfield. The range in which the curve N is nearly horizontal generally is the range in which a shift in the focal point does not exceed the field curvature at the subfield edge.

Also, whenever the focal point is changed as described above, regardless of the magnitude of the change, blur and Δblur are minimized and the depth of focus is increased, compared to situations in which the focal point is not changed.

Figure 3:
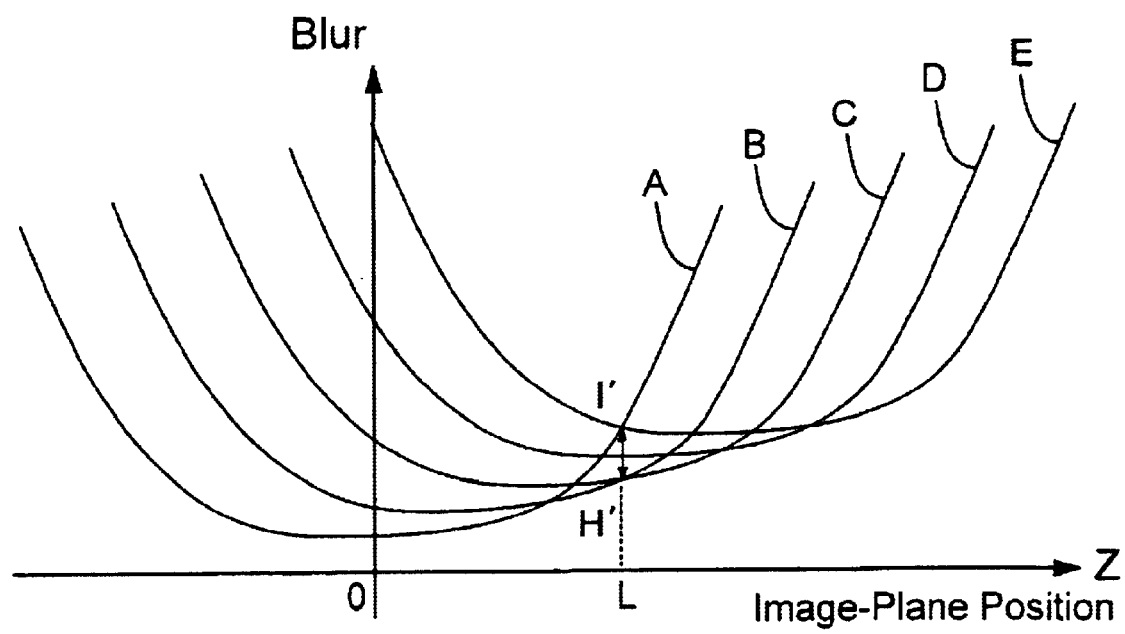
FIG. 3 depicts plots of respective blur, at each of various locations in a subfield, obtained when the focal point is changed in a scanning manner during exposure.

FIG. 3 is a plot of exemplary results of simulations of blur, at various positions A, B, C, D, E in a subfield, obtained while changing the focal point in a scanning manner ("scanning" the focal point). As can be understood from FIG. 3, the minimum blur is increased compared to when the focal point is not scanned (compare FIG. 3 to FIG. 7). However, with focal-point scanning, the range of image-plane positions at which blur is minimal is wider at the various positions A–E in the subfield (compare the widths of the troughs of each curve in FIG. 3 with the widths of the troughs in corresponding curves in FIG. 7). In other words, by scanning the focal point in the vicinity of the image-plane position at which blur is at a minimum, the amount by which blur changes and the magnitude of Δblur (indicating uniformity of blur within the exposure plane) are reduced compared to a situation in which such scanning is not performed. This corresponds to increasing the depth of focus.

Thus, Δblur at position L in FIG. 3 (i.e., the difference in blur when blur is at its minimum at point H' and at its maximum at point I') is at a minimum at the image-plane position corresponding to H'I' in the figure. This value is smaller than the Δblur associated with the image-plane position corresponding to HI in FIG. 7.

Hence, by changing the focal point while making an exposure, and moving the substrate away from the Gaussian-image plane, blur can be decreased, and Δblur improved within the exposure area. In FIG. 3, measurements were obtained at five points (A–E) in the subfield. However, obtaining measurements at a larger number of points could facilitate finding a position at which blur is even less.

Figure 8A:
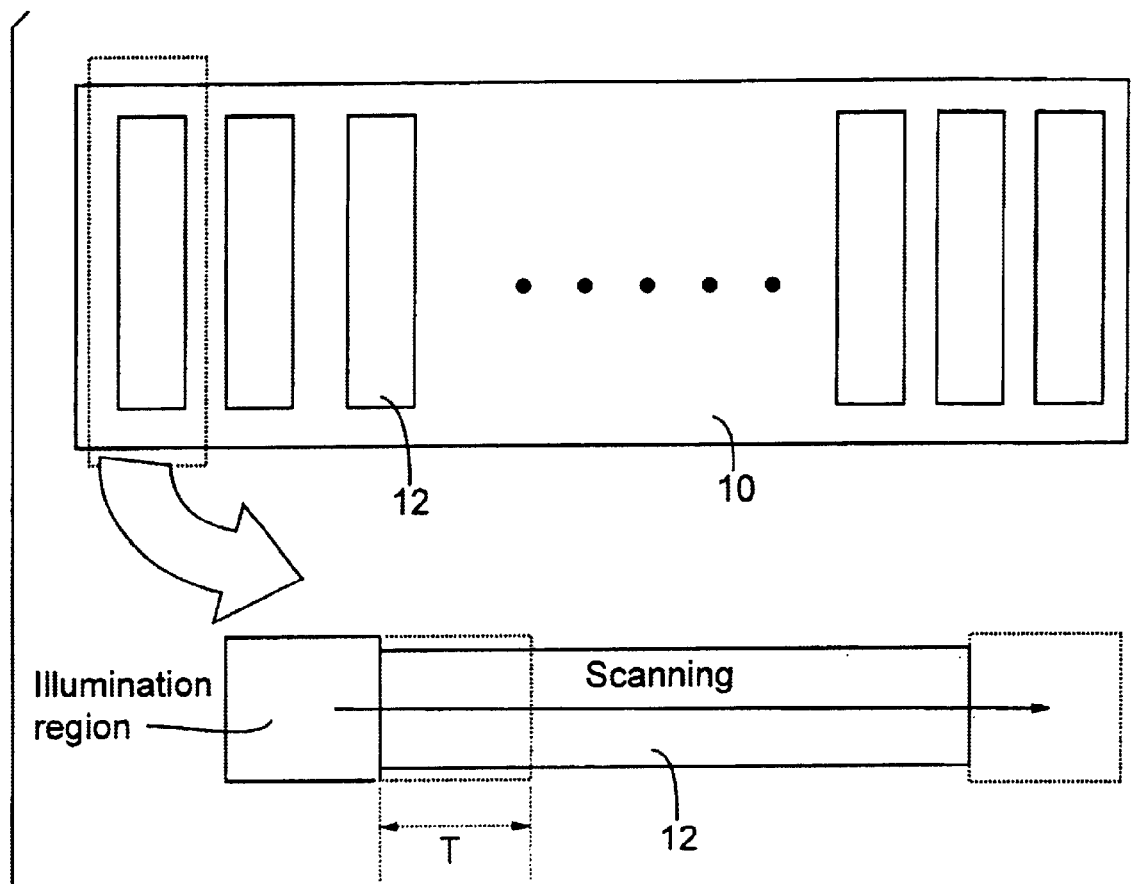
FIG. 8(a) depicts an exposure scheme in which the subfields of a deflection band are exposed in a continuous scanning manner.

If the subfields are exposed in individual respective "shots," one or more of the shots can be performed while changing the focal point, as described above. It also is possible to expose subfields in a continuous, scanning manner. In such a scheme, the subfields of the pattern typically are arranged in one or more "stripes" each divided into multiple "slots" (also termed "deflection bands") each containing a row of respective subfields arranged contiguously. During exposure of a deflection band, the subfields are not exposed in respective shots, but rather are exposed in a continuous, scanning manner. This scheme is shown in FIG. 8(a), depicting a stripe 10 and some of its constituent deflection bands 12. Each deflection band 12 contains multiple respective subfields (not detailed) arranged in a row. Exposure of the subfields in a deflection band 12 begins by directing the illumination beam at one end of the deflection band 12, and then sweeping the beam laterally in a continuous manner to expose the subfields of the deflection band. In the figure, "T" is the time required to expose a single subfield of the deflection band, wherein T is defined by the scanning velocity ("V") of the beam and the width ("W") of the illuminated region: T=W/V. During this scanning exposure, the focal point is changed as required as described above.

Figure 8B:
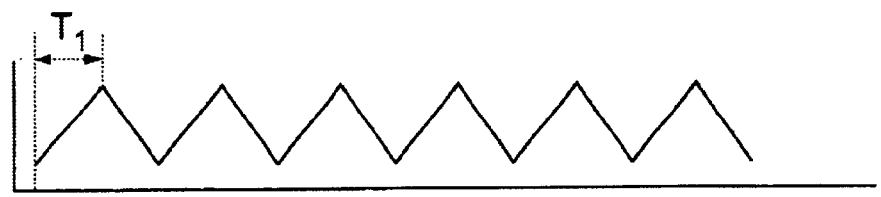
FIG. 8(b) is a representative input-current signal of a focus-lens coil obtained in the exposure scheme shown in FIG. 8(a).

For example, as successive deflection bands are being exposed, the input-current signal of the focus-lens coil can have a profile as shown in FIG. 8(b), wherein each sawtooth corresponds to the exposure of a respective deflection band of the stripe. The time $T_f$ is the half cycle of the sawtooth signal. The relationship of T with the time $T_f$ is $T=nT_f$, wherein n is an integer.

Figure 4:
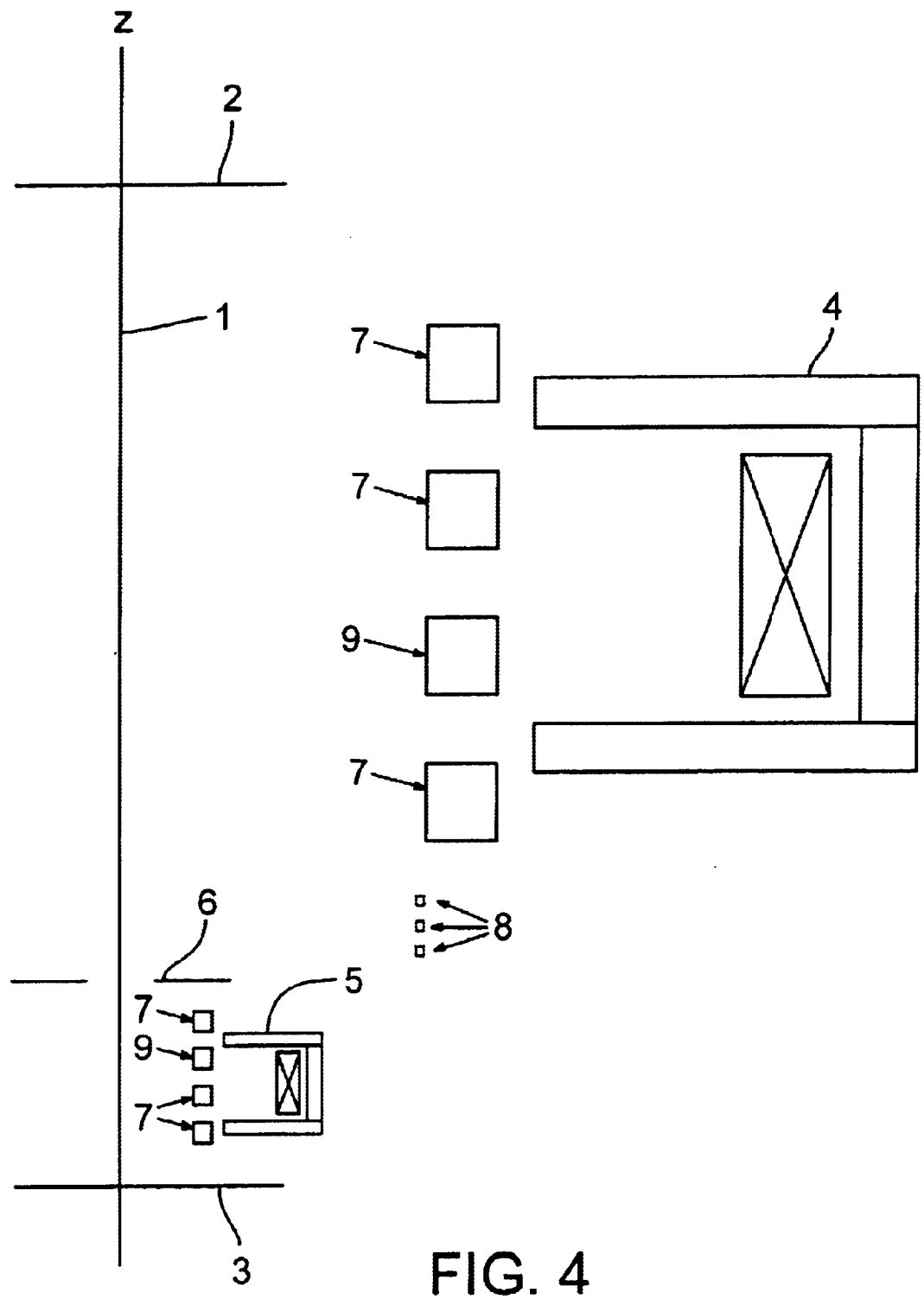
FIG. 4 is a schematic elevational diagram of certain components of a projection-optical system in a charged-particle-beam microlithography apparatus according to a representative embodiment.

An overview of an embodiment of a projection-optical system of a CPB microlithography (projection-exposure) apparatus is shown in FIG. 4. In the figure, an optical axis 1 extends parallel to the Z-axis. A reticle 2 and substrate 3 (typically a semiconductor "wafer") are situated on the axis 1. The projection-optical system comprises a reticle-side lens 4 and a wafer-side lens 5, with an aperture 6 situated axially therebetween. The projection-optical system also includes a deflector 7, a dynamic focus lens 8, and a stigmator 9. The depicted projection-optical system is configured to perform pattern projection-transfer from the reticle 2 to the substrate 3 at a "reduction" (demagnification) factor of ¼.

The surface of the reticle 2 is illuminated by an electron beam ("illumination beam") passing through an illumination-optical system (not shown but understood as being situated axially upstream of the reticle). The beam downstream of the reticle 2 is termed a "patterned" beam or "imaging" beam. The reticle-side lens 4 and wafer-side lens 5 collectively form an image on the substrate of the pattern portion on the reticle 2 illuminated by the illumination beam. The deflector 7 functions to deflect the patterned beam as required for forming respective images, on the substrate 3, of reticle subfields that are displaced laterally from the optical axis. Hence, the images on the substrate 3 similarly are displaced laterally (taking into account the demagnification factor). The dynamic-focus coil 8 and stigmator 9 are used for correcting field curvature and astigmatism, respectively, accompanying beam deflection.

In conventional electron-beam microlithography apparatus, the dynamic-focus coil 8 is maintained in a constant operational state as each shot is being exposed (i.e., during exposure of a subfield). In contrast, in this embodiment, the dynamic-focus coil 8 is energized in a controlled manner to make corrections to the focal point as the exposure is being made. Thus, the dynamic-focus coil 8 has the function of micro-adjusting the focal point at high speed during individual exposures. Normally, the time required for an exposure of a subfield is about 0.1 $\mu$sec, during which time a change of approximately 25 $\mu$m in the focal point easily can be accomplished by the dynamic-focus coil 8.

With the exception of the manner in which the dynamic-focus coil 8 is operated in this apparatus embodiment, as described above, the dynamic-focus coil 8 can have the same coil configuration and location as a dynamic-focus coil in a conventional CPB microlithography apparatus. Hence, the structure of the dynamic-focus coil 8 is not described in detail herein.

The apparatus desirably includes a substrate stage (not shown but well understood in the art) on which the substrate is mounted during exposure. The stage can be configured to move the substrate relative to the Gaussian-image plane during individual exposures.

Figure 5:
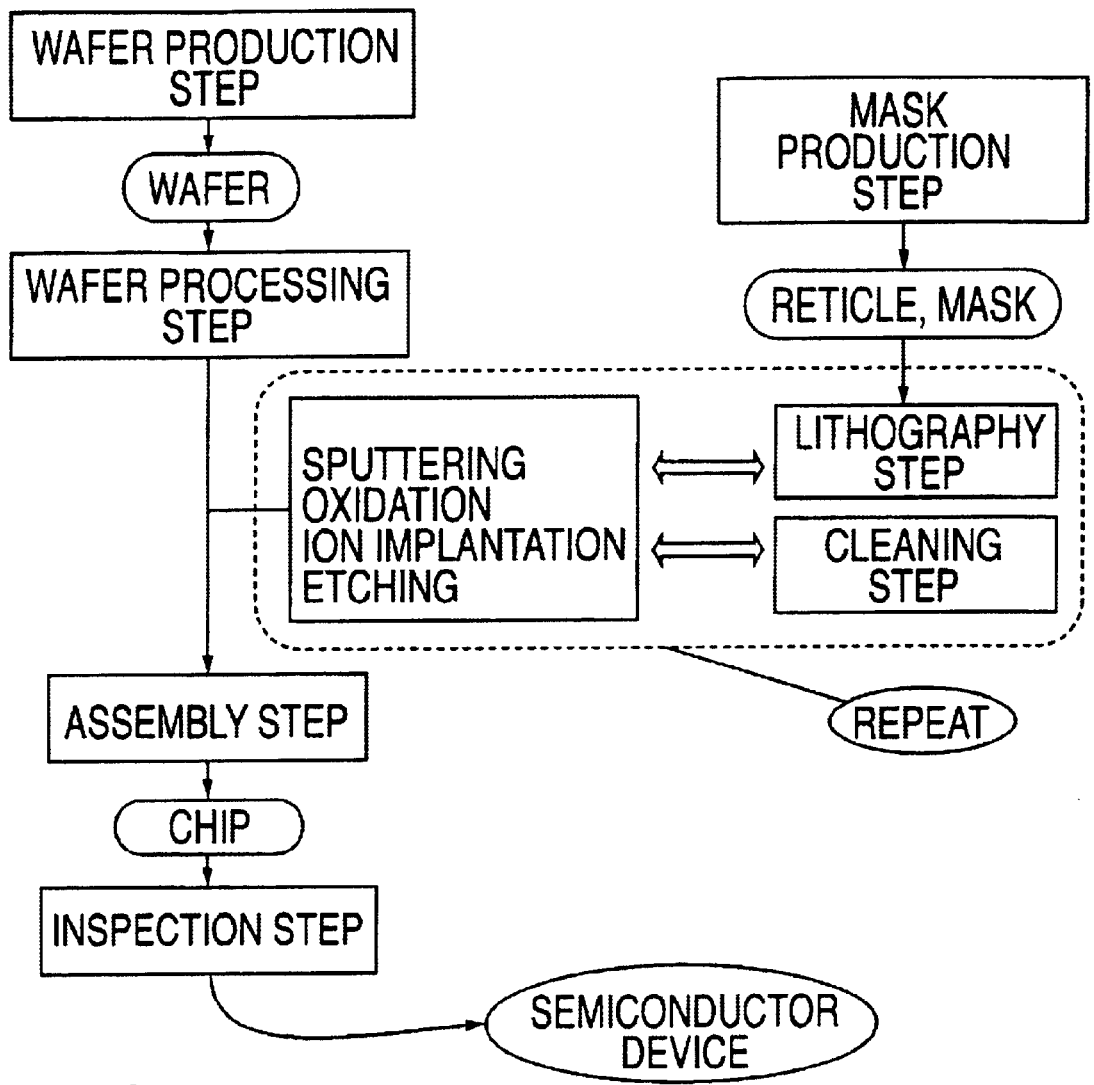
FIG. 5 is a process flowchart for manufacturing a microelectronic device, wherein the process includes a microlithography step incorporating blur reduction as described herein.

FIG. 5 is a flowchart of an exemplary microelectronic-fabrication method that utilizes apparatus and methods according to the invention. The fabrication method generally comprises the main steps of: (1) substrate production (wafer preparation), in which a wafer material is produced, wafers are sliced therefrom, the wafers are polished, and the wafers are prepared for subsequent processing; (2) reticle production in which a reticle as used for microlithography is manufactured and prepared for use; (3) wafer processing in which necessary process steps are performed on the wafer in order to form one or more devices ("chips") on the wafer; (4) device assembly, involving cutting individual devices from the wafer, packaging the devices, and making the devices operational; and (5) device inspection. Each step usually comprises several sub-steps. The produced reticle is divided into multiple subfields each defining a respective portion of the pattern defined by the entire reticle.

Among these main steps, wafer processing is key to achieving the smallest feature sizes (critical dimensions) and best inter-layer registration. In the wafer-processing step, multiple circuit patterns are layered successively atop one another on the wafer, forming multiple chips destined to be memory chips or main processing units (MPUs), for example. The formation of each layer typically involves multiple sub-steps. Usually, many operative microelectronic devices are produced on each wafer.

Typical wafer-processing steps include: (1) thin-film formation (by, e.g., sputtering or CVD) involving formation of a dielectric layer for electrical insulation or a metal layer for connecting wires or electrodes; (2) an oxidation step to oxidize the substrate or the thin-film layer previously formed; (3) microlithography of a pattern defined on a reticle, to form a resist pattern or the like for selective processing of the thin film or the substrate itself; (4) etching or analogous step (e.g., dry etching) to etch the thin film or substrate according to the resist pattern; (5) doping as required to implant ions or impurities into the thin film or substrate according to the resist pattern; (6) resist stripping to remove the remaining resist from the wafer; and (7) wafer inspection. Wafer processing is repeated as required (typically many times) to fabricate the desired microelectronic devices on the wafer.

Figure 6:
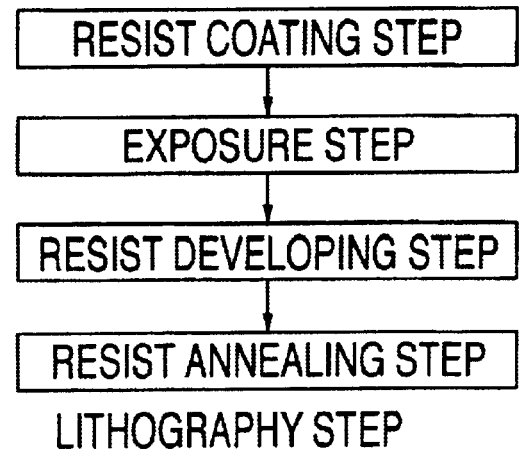
FIG. 6 is a process flowchart for performing the microlithography step in the process of FIG. 5.

FIG. 6 provides a flow chart of typical steps performed in microlithography, which is a principal step in wafer processing. The microlithography step typically includes: (1) a resist-application step, wherein a suitable resist is coated on the wafer substrate (which can include a circuit element formed in a previous wafer-processing step); (2) an exposure step, to expose the resist with the desired pattern; (3) a development step, to develop the exposed resist to produce the imprinted image; and (4) an optional resist-annealing step, to enhance the durability of the resist pattern. The exposure step is performed while reducing blur and $\Delta$blur as described herein.

The process steps summarized above are all well known and are not described further herein.

Methods and apparatus according to the invention can be applied especially during the lithography step to provide more accurate transfer of patterns to the surface of the wafer.

Whereas the invention has been described in connection with multiple representative embodiments, it will be understood that the invention is not limited to those embodiments. On the contrary, the invention is intended to encompass all alternatives, modifications, and equivalents as may be included within the spirit and scope of the invention, as defined by the appended claims.

What is claimed:

1. In a method for performing a charged-particle-beam (CPB) microlithographic exposure of a pattern from a reticle to a substrate, performing an exposure of at least a region of the pattern while simultaneously changing a focal point of an image of the exposed portion on the substrate.

2. The method of claim 1, wherein the focal point is changed in a continuous scanning manner during the exposure.

3. The method of claim 1, wherein the focal point is changed within a range in which maximum blur within the region is within a predetermined tolerance for blur.

4. The method of claim 1, wherein the focal point is changed within a range in which maximum blur within the region is less than a predetermined threshold blur for the region.

5. The method of claim 1, wherein the focal point is changed within a range in which a plot of blur versus focal-point position at an edge of the region is substantially horizontal.

6. The method of claim 1, wherein the focal point is changed within a range in which a shift in focal point does not exceed a field curvature at an edge of the region.

7. The method of claim 1, wherein the focal point is changed by scanning the focal point in a vicinity of an image-plane position at which blur is minimum.

8. The method of claim 1, wherein the focal point is changed by moving the substrate relative to a Gaussian-image plane for the substrate.

9. In a charged-particle-beam microlithography method in which a substrate is exposed with a pattern defined on a reticle segmented into subfields each defining a respective portion of the pattern, and the subfields are individually exposed, a method for reducing at least one of blur and variation of blur in an image of a subfield as projected onto the substrate, the method comprising:

during the exposure, simultaneously changing a focal point of the respective subfield image as exposed onto the substrate.

10. The method of claim 9, wherein the focal point is changed in a continuous scanning manner during the exposure.

11. The method of claim 9, wherein the focal point is changed within a range in which maximum blur within the subfield image is within a predetermined tolerance for blur.

12. The method of claim 9, wherein the focal point is changed within a range in which maximum blur within the subfield image is less than a predetermined threshold blur for the subfield.

13. The method of claim 9, wherein the focal point is changed within a range in which a plot of blur versus focal point at an edge of the subfield image is substantially horizontal.

14. The method of claim 9, wherein the focal point is changed within a range in which a shift in focal point does not exceed a field curvature at an edge of the subfield image.

15. The method of claim 9, wherein the focal point is changed by scanning the focal point in a vicinity of an image-plane position for the subfield at which blur in the subfield image is minimum.

16. The method of claim 9, wherein the focal point is changed by moving the substrate relative to a Gaussian-image plane for the substrate.

17. The method of claim 9, wherein:
the subfields are exposed in individual exposure shots; and
the focal point is changed during exposure of at least one exposure shot.

18. The method of claim 9, wherein:
the reticle comprises at least one stripe comprising multiple deflection bands each containing multiple subfields;
each deflection band is exposed in a respective continuous scanning manner; and
the focal point is changed during exposure of at least one deflection band.

19. A method for fabricating a micro-electronic device, the method comprising a charged-particle-beam (CPB) microlithography step in which a pattern is exposed from a reticle to wafer on which the device is formed, the CPB microlithography step being performed as recited in claim 1.

20. A method for fabricating a micro-electronic device, the method comprising a charged-particle-beam (CPB) microlithography step in which a pattern is exposed from a reticle to wafer on which the device is formed, the CPB microlithography step being performed as recited in claim 9.

21. A charged-particle-beam (CPB) microlithography apparatus, comprising:
a CPB optical system situated and configured to projection-expose respective images of subfields of a pattern, as defined on a reticle, onto a substrate; and
a dynamic-focus coil situated and configured to change, simultaneously during exposure of a subfield, a focal point of the respective subfield image on the substrate.

22. The CPB microlithography apparatus of claim 21, wherein:
the CPB optical system comprises a projection-optical system situated between the reticle and the substrate; and
the dynamic-focus coil is situated in the projection-optical system.

23. The apparatus of claim 21, wherein the dynamic-focus coil is configured to change the focal point in a continuous scanning manner during the exposure.

24. The apparatus of claim 21, further comprising means for moving the substrate relative to a Gaussian-image plane for the substrate, so as to change the focal point during the exposure.

25. A method for performing charged-particle-beam (CPB) microlithography, comprising:
defining a pattern on a reticle divided into multiple exposure regions each defining a respective portion of the pattern;
individually irradiating the exposure regions and exposing respective images of the exposure regions on the substrate; and
during at least one exposure, simultaneously changing a focal point of the respective image as exposed onto the substrate.

26. A method for performing charged-particle-beam (CPB) microlithography, comprising:
defining a pattern on a reticle divided into multiple subfields each defining a respective portion of the pattern;
individually irradiating the subfields and exposing respective images of the subfields on the substrate; and
during at least one exposure, reducing at least one of blur and variation of blur in the respective subfield image by simultaneously changing a focal point of the respective subfield image as exposed onto the substrate.

* * * * *